United States Patent [19]

Langlie et al.

[11] Patent Number: 4,560,827

[45] Date of Patent: Dec. 24, 1985

[54] ELECTRIC FENCER UTILIZING A SEALED PLASTIC HOUSING

[76] Inventors: Howard Langlie; Albert T. Berg, Jr., both of Ellendale, Minn. 56026

[21] Appl. No.: 572,708

[22] Filed: Jan. 23, 1984

[51] Int. Cl.$^4$ ............................................. H05K 5/06
[52] U.S. Cl. ................................. 174/52 S; 174/65 R; 220/DIG. 31; 256/10
[58] Field of Search ................. 174/52 S, 52 R, 65 R, 174/66, 50, 50.5, 135, 92; 256/10; 220/359, 352, 3.3, 3.2, 3.8, 3.9, DIG. 31

[56] References Cited

U.S. PATENT DOCUMENTS

| | | | |
|---|---|---|---|
| 3,204,481 | 9/1965 | Golden | 174/92 |
| 3,519,731 | 7/1970 | Grunbaum | 174/92 |
| 3,680,203 | 8/1972 | Braiman et al. | 174/52 S |
| 3,809,798 | 5/1974 | Simon | 174/135 |

OTHER PUBLICATIONS

E. Obeda, "How to Get Good Ultrasonic Welds", 10/64, pp. 2-4.

Primary Examiner—Laramie E. Askin
Assistant Examiner—D. A. Tone
Attorney, Agent, or Firm—Peterson, Wicks, Nemer & Kamrath

[57] ABSTRACT

The electric fencer includes two plastic components having an interfitting groove and rib, as well as integral pins on one component which are pressed into recesses in the other component. The two components are sonically welded together to form a completely sealed housing. Additionally, a grommet resists the entrance of moisture along the power cord, as well as firmly gripping the power cord. The grommet is composed of a U-shaped groove on one component and a tongue on the other component, the tongue pressing against the power cord's insulation so that some of the insulation is forced into the U-shaped groove. The top of the housing overhangs the front panel so as to shield the light coming from a small neon light so that the light can be more readily seen in direct sunlight, the side walls inclining forwardly so that their upper portions assist in the shielding action.

12 Claims, 10 Drawing Figures

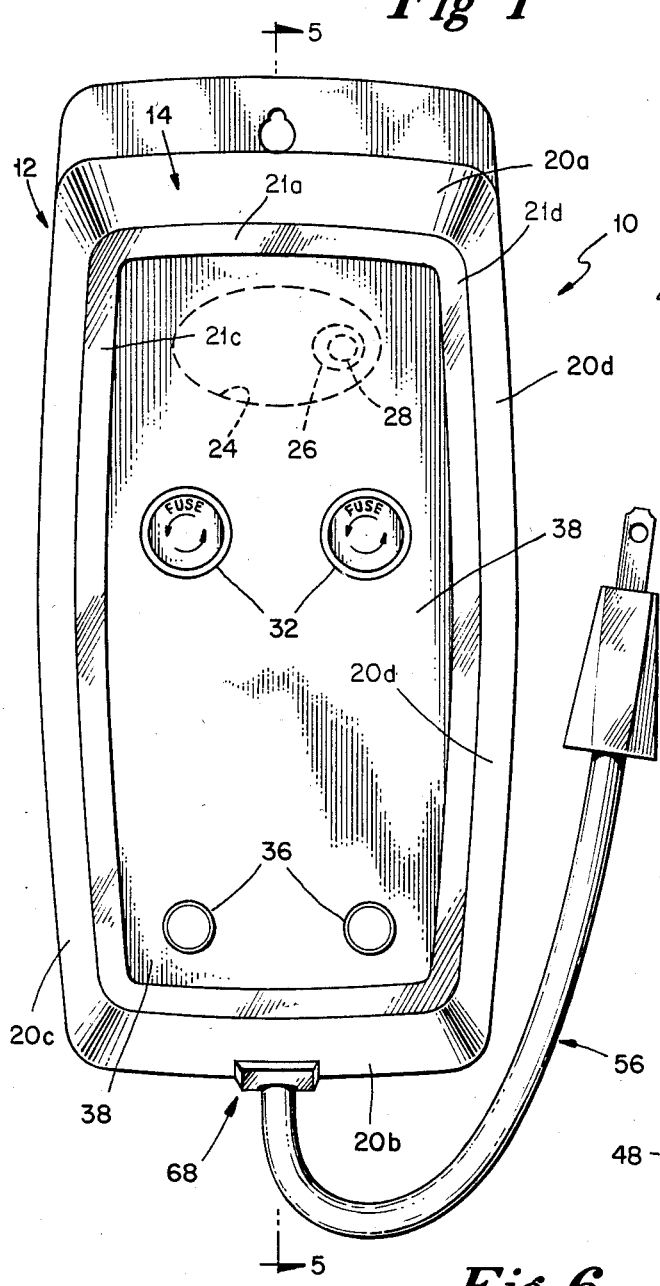
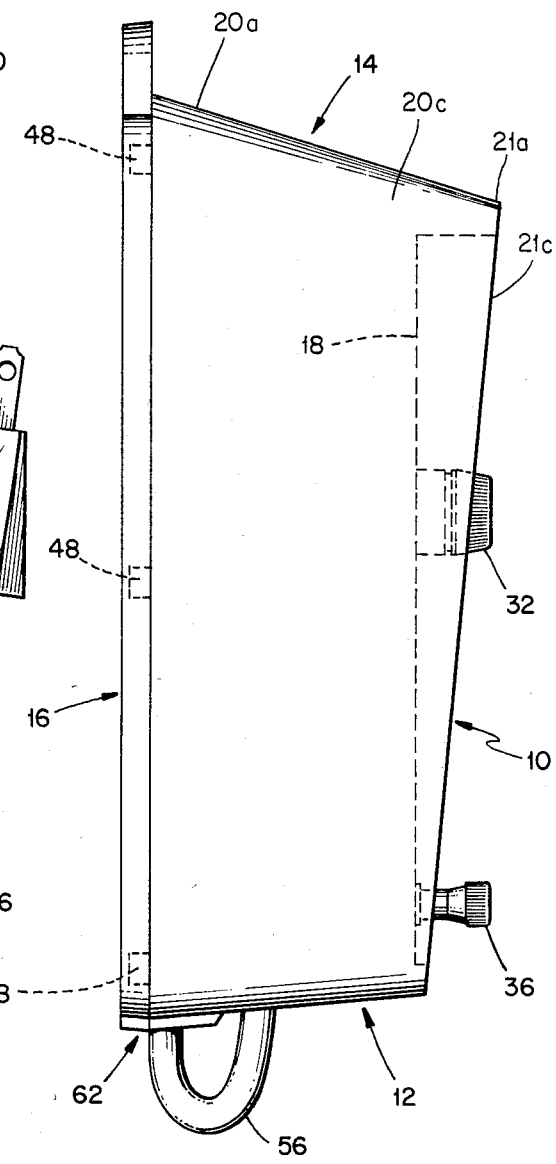
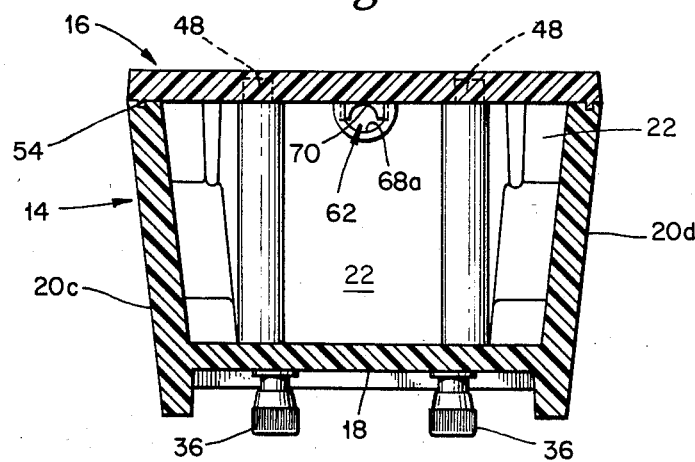

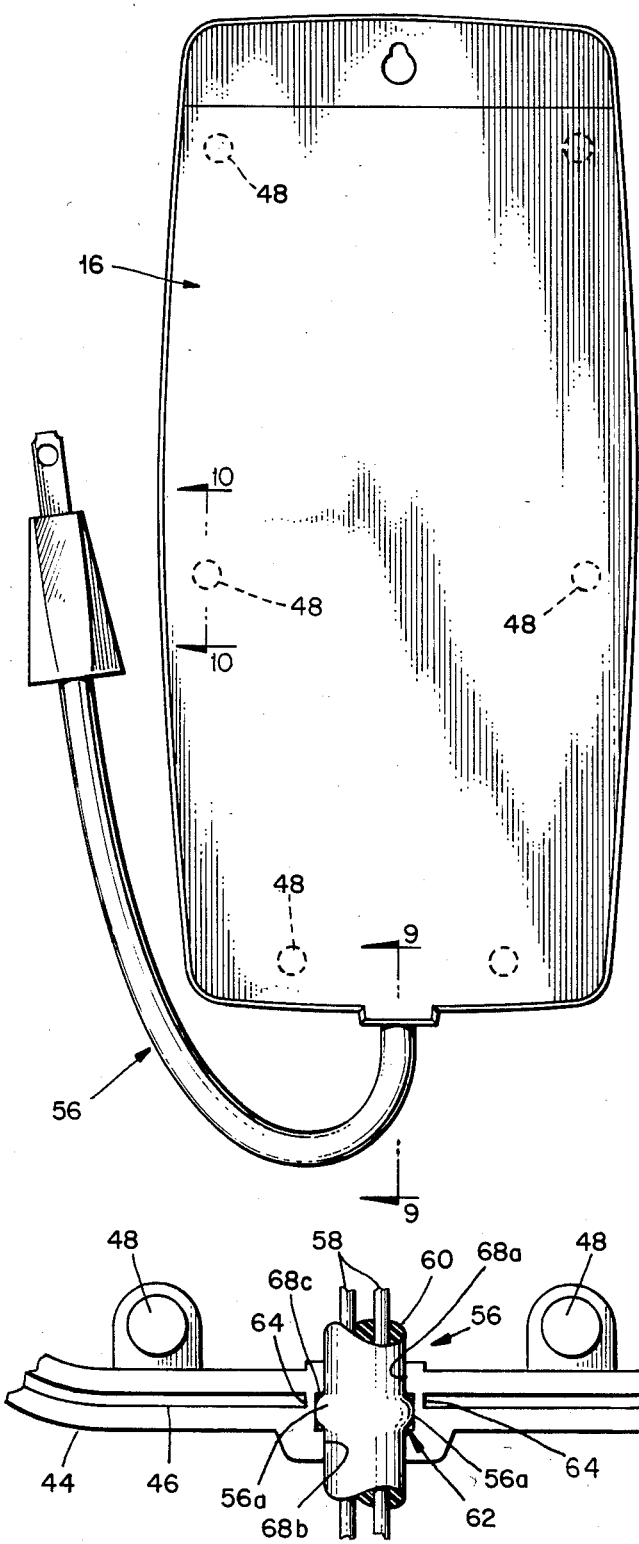
Fig 3
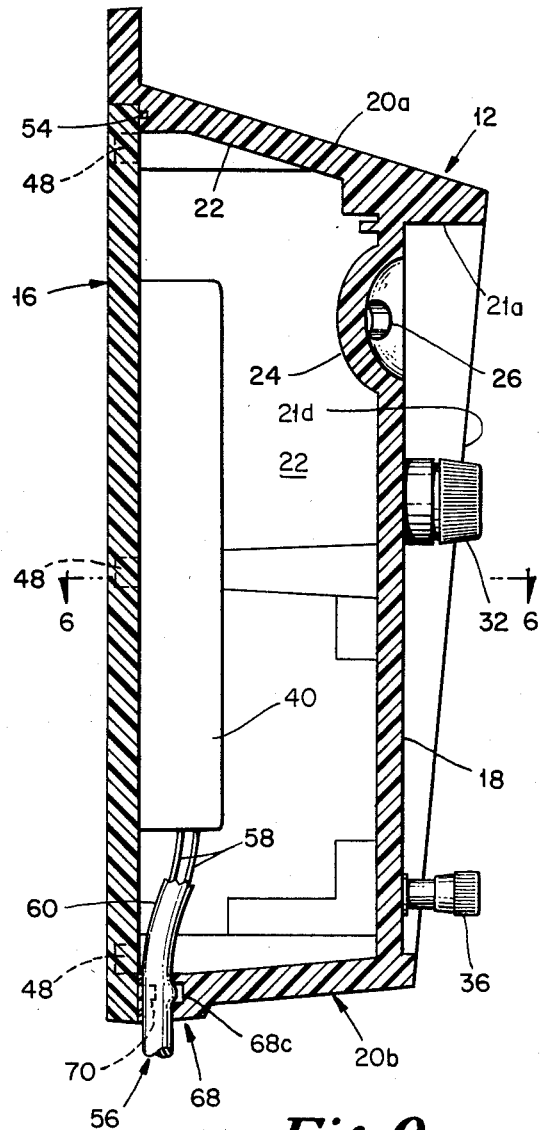
Fig 5
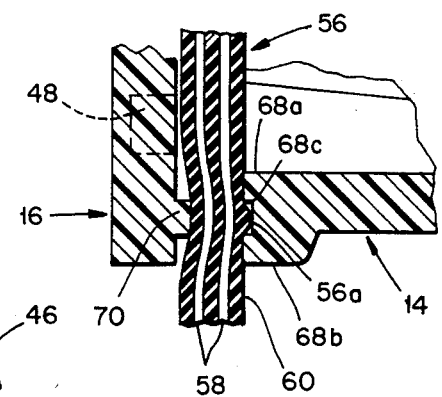
Fig 9
Fig 8

*Fig 7*
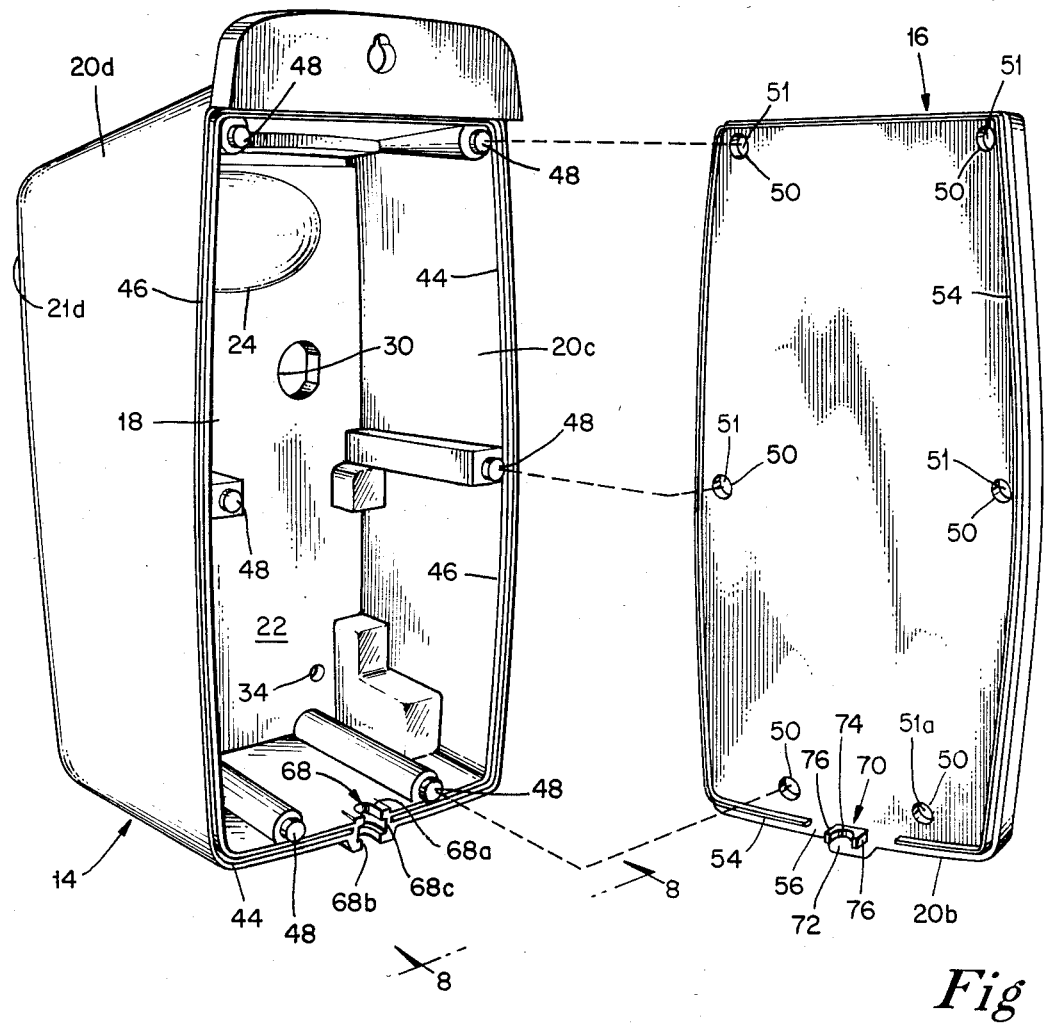
*Fig 4*
*Fig 10*
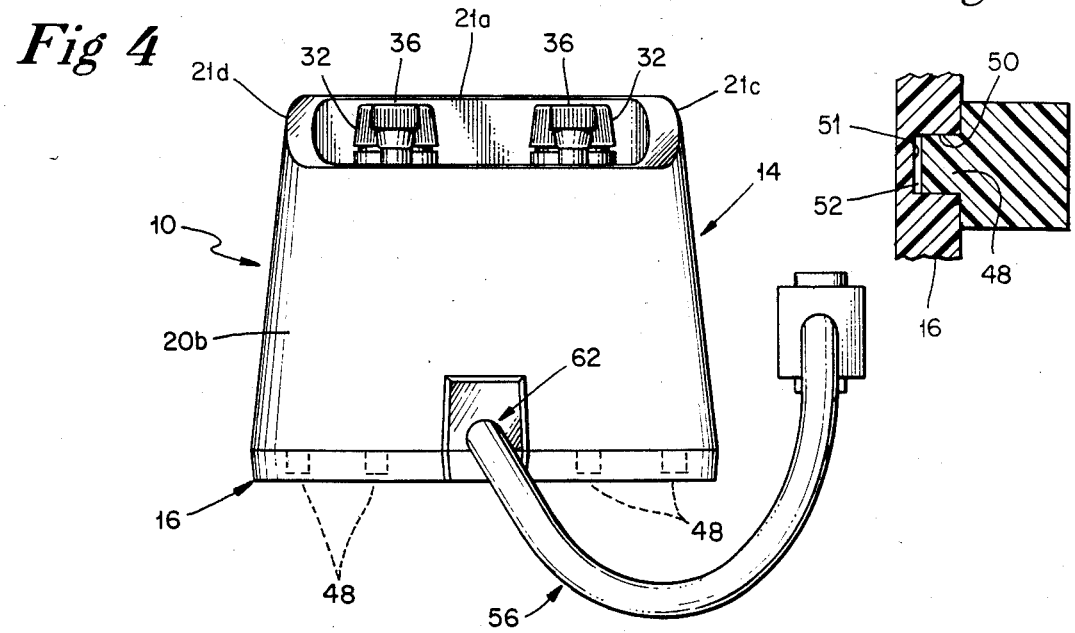

ELECTRIC FENCER UTILIZING A SEALED PLASTIC HOUSING

BACKGROUND OF THE INVENTION

1. Field of the Invention

This invention relates generally to electric fencers and pertains more particularly to a fencer utilizing a sealed plastic housing.

2. Description of the Prior Art

Electric fencers have been widely used by farmers and ranchers for effectively confining livestock within a given area. However, the usual housings are relatively large and require mounting techniques for the components contained therein which unduly increase the manufacturing costs thereof and also pose a reliability problem in some instances, particularly when left unattended in adverse environments involving a considerable amount of moisture.

SUMMARY OF THE INVENTION

An object of the invention is to provide an electric fencer comprising a plastic housing that will be virtually moisture proof. In this regard, an aim of the invention is to provide a housing that is initially of two parts, but which is completely sealed together. Also, an aim of the invention is to provide an integral grommet means for firmly gripping the power cord and at the same time preventing entrance of moisture along the power cord into the interior of the housing.

Another object is to provide an electric fencer utilizing a housing that will for all intents and purposes be tamper proof.

An additional object is to provide a housing that effectively shields the indicating lamp from the sun so that the lamp can be more readily observed.

Also, the invention has for an object the providing of an electric fencer that will be quite compact, the size thereof being considerably reduced over prior art fencers.

Still further, an object is to provide an electric fencer that is aesthetically pleasing in appearance.

Briefly, the invention herein disclosed envisions an electric fencer utilizing a housing comprised initially of two plastic components. One plastic component constitutes a casing having a front wall and rearwardly extending side walls, the rear edge of the side walls residing in a single plane and having formed therein a groove that is substantially continuous along the rear edge. The top and side walls extend forwardly from the front wall of the casing so as to shield a small signal lamp from the sun's rays in order that it can be more readily observed. Located somewhat inwardly from the side walls is a number of integral pins that extend rearwardly into an equal number of recesses formed in a rear wall or panel constituting the second of the two plastic components, the pins enabling the rear wall to be secured permanently to the casing to close the interior of the casing and form the completely sealed housing comprised of the casing and rear wall.

Inasmuch as it is planned that the housing be fabricated from a thermoplastic material having good dielectric properties, such as reinforced polycarbonate plastic, the pins, when received in the recesses provided in the rear wall, afford a ready means of retaining fixedly the rear wall in place. More specifically, the pins are slightly larger in diameter than the recesses, thereby providing a press fit. Also, the pins are somewhat shorter than the recesses. In this way, by employing sonic welding, the pins secure the rear wall in place against the rear edges of the side walls of the casing. Additionally, the rear wall has a forwardly projecting rib that fits into a groove on the rear edge of the side walls, the rib likewise being sonically welded within the groove, thereby resisting any passage of moisture around the rear edges of the side walls.

Still further, provision is made for preventing any moisture from entering the housing along the power cord. The arrangement performs a dual function in that in addition to blocking the entrance of moisture, the power cord is firmly gripped so that it can withstand relatively severe pulling or dislodging forces that might otherwise cause the power cord to become loosened or completely detached from the housing. The integral grommet means for both resisting the passage of moisture and for gripping the power cord includes a U-shaped recess having a U-shaped groove in the wall thereof that extends forwardly from the rear edge of the side walls. Registrable with the U-shaped groove is a tongue that is integral with the forward surface of the rear wall, the tongue having a U-shaped notch therein that forms two forwardly projecting fingers that fit into the rear portions of the groove formed in the U-shaped recess. The tongue is sonically welded in the U-shaped recess.

BRIEF DESCRIPTION OF THE DRAWINGS

FIG. 1 is a front elevational view of an electric fencer illustrating the invention;

FIG. 2 is a side elevational view of the fencer shown in FIG. 1;

FIG. 3 is a rear elevational view of the fencer;

FIG. 4 is a bottom plan view looking upwardly;

FIG. 5 is a vertical sectional view of the electric fencer, including a section of the power cord, showing the rear wall in place;

FIG. 6 is a horizontal sectional view taken in the direction of line 6—6 of FIG. 5;

FIG. 7 is what might be called an "open-face" view of the casing and the rear wall, the view showing by dashed lines certain components that become mated when the rear wall is placed against the casing;

FIG. 8 is an elevational view taken in the direction of line 8—8 of FIG. 7 but with the power cord elevationally added and bulging due to the reactive pressure of the tongue appearing at the right in FIG. 7, the tongue, of course, not being visible in this view;

FIG. 9 is a sectional view taken in the general direction of line 9—9 in FIG. 3 which view shows the tongue and the reactive pressure applied thereby to produce the bulge shown in FIG. 8, as well as in this view, and FIG. 10 is an enlarged sectional detail taken in the direction of line 10—10 of FIG. 3.

DESCRIPTION OF THE PREFERRED EMBODIMENT

An electric fencer exemplifying our invention has been denoted generally by the reference numeral 10 comprising a housing 12 of dielectric material, preferably a fiberglass reinforced polycarbonate. Initially, the housing 12 includes two separate components: a casing 14 and a rear wall or panel 16.

Describing the casing 14 in detail, it is to be observed that it includes a front wall 18 and four side walls labeled 20a, 20b, 20c and 20d forming a void or cavity 22.

Inasmuch as it is planned that the fencer 10, when employing the teachings of our invention, be mounted either vertically as shown in the drawings or horizontally with a slight modification thereof, the side walls 20 will simply be referred to as side walls, even though, strictly speaking, one would consider the wall 20a a top wall, the wall 20b a bottom wall and only the vertical walls 20c and 20d as side walls. The top wall 20a extends forwardly from the face of the front wall 18 for a purpose presently to be explained, the forwardly projecting portion being labeled 21a. The side walls 20c, 20d incline upwardly and forwardly from the forward edge of the bottom wall so as to meet the forward edge of the projecting portion 21a, the forwardly inclining portions of the side walls 20c and 20d being labeled 21c and 21d, respectively.

The front wall 18 is formed with an oval cavity 24 having a hole 26 near one end thereof which enables a small neon lamp 28 (shown in dotted outline in FIG. 1) to be employed. The front wall 18 also has a pair of relatively large holes 30 for the accommodation of a pair of fuse holders 32. Still further, the front wall has a pair of smaller holes 34 for the accommodation of a pair of terminals 36, one to be connected to the wire of an electric fence and the other to be connected to ground.

A thin sheet 38 of translucent plastic material overlies the front wall 18, the sheet 38 being present only in FIG. 1. In this way, the lamp 28 is concealed but owing to the translucency of the plastic material, the blinking or flashing of the lamp 28 can be readily perceived by reason of the overhanging or projecting portion 21a of the top wall 20a and the forwardly inclined portions 21c and 21d of the side walls 20c and 20d, respectively. In this way, the portions 21a, 21c and 21d provide a light shield, thereby preventing the sun's rays from directly striking that portion of the front wall 18 where the lamp 28 is located.

The fuse holders 32 and the terminals 36 are not part of our invention. Likewise, the specific design of the means for providing the high voltage pulses is not part of our invention, but is denoted generally by the reference numeral 40 in FIG. 5 for the sake of completeness. All that need be understood is that the unit 40 contained within the housing 12 includes a step-up transformer that produces high voltage pulses from relatively low voltage pulses, the relatively low voltage pulses being derived from the unit and the high voltage pulses being delivered to the two terminals.

Inasmuch as the configuration of the casing 14 and the rear wall 16 play a relatively important part in the practicing of our invention, the casing 14 will now be described in even greater detail. Thus, it will be discerned that the rear edges labeled 44 of the side walls 20 reside in a single plane. The rear edges 44, as can be understood from FIG. 7, as well as other figures, has formed therein a substantially continuous groove 46. The portion of the groove 46 associated with the side wall 20b is interrupted for a purpose hereinafter explained.

At this stage, attention is directed to a number of rearwardly extending cylindrical pins 48. These pins 48 are formed when molding the casing 14 and are located somewhat inwardly relative to the rear edges 44 of the side walls 20. Actually, six such pins 48 have been found sufficient in actual practice. Six circular or cup-shaped recesses 50 are formed in the rear wall 16, the recesses 50 having a bottom labeled 51. The recesses 50 are slightly smaller in diameter than the diameter of the pins 48. It should be noted, too, that the pins 48 have a length somewhat less than the depth of the recesses 50 such that the ends of the pins 48 do not abut or engage the bottoms 51 of the recesses 50 (see FIG. 10). Thus, a space 52 (see FIG. 10) exists between the ends of the pins 48 and the bottoms of the various recesses. One nicety of the invention is that the space can vary, thereby providing a considerable amount of leeway or tolerance in the designing of the molds, both as to the thickness of the rear wall 16 and the length of the pins 48. It is planned that the clearance be on the order of 1/16 inch to ⅛ inch. The press fit, however, between the pins 48 and the walls of the recesses 50 would be only about from 0.000 to 0.001 inch.

It should also be observed that the rear wall 16 has a forwardly projecting rib 54 that extends for the most part completely around the marginal portions of the forward face of the rear wall 16. However, there is a gap 56 in the portion of the rib 54 extending across the bottom of the rear wall 16 just above the edge 20b. From FIGS. 5 and 6, and to a certain extent from FIG. 7, it can be appreciated that the rib 54 fits into the groove 46.

Because it is intended that the housing 12 be completely sealed, it is contemplated that the electric fencer 10, whether battery operated or operated from a utility power line, have a power cord 56 connected thereto. More specifically, the power cord 56 includes two insulated conductors 58 and an outer elastomeric sheath 60. It will be understood that one of the conductors 58 leads to one of the fuse holders 32 and the other conductor 58 leads to the other fuse holder 32. It has already been explained that the unit 40 supplies intermittent electric pulses, doing so through a transformer connected to the terminals 36. The power cord 56, however, provides a path along which moisture can enter into the cavity 22 within the housing 12.

Integral grommet means 62 prevents the entrance of moisture along the power cord 56. It has already been explained that the groove 46 has been interrupted. The small vertical walls or closed ends of the groove 46 in the region where it has been interrupted have been denoted by the numeral 64 in FIG. 8, although these walls can also be seen at the left in FIG. 7. Even though the closed ends 64 form part of the grommet means 62, the means 62 chiefly constitutes a U-shaped recess 68 composed of upper and lower curved wall portions 68a, 68b and an intermediate U-shaped groove 68c between the upper and lower wall portions 68a, 68b.

What should be appreciated at this stage is that the U-shaped groove 68c is configured or sized so as to accommodate therein a semicylindrical segment of the power cord 56. Consequently, when the rear wall 16 has not been placed against the rear edges 44 of the casing 14, then the segment of cord 56 is only loosely received in the recess 68.

By virtue of a tongue 70 having a U-shaped notch 72 forming curved bight 74 and forwardly projecting legs 76, when the rear wall 16, the tongue 70 being integral therewith, is placed against the rear edges 44 of the casing 14, then the tongue 70 presses against the segment of cord 56 so as to force the forwardmost portion of the cord 56 into the U-shaped recess 68c. Stated somewhat differently, the tongue 70 which has the same thickness as the groove 68c, provides what might be termed an offset in the cord, creating a bulge 56a that virtually fills the U-shaped recess 68c.

It is not necessary that the U-shaped recess 68c be completely filled by the elastomeric material 60 that is pressed thereinto by the tongue 70, the offsetting that does occur being adequate to provide an effective seal against the passage of moisture and to also provide an effective gripping by reason of the forceful engagement that the tongue 70, more specifically, its bight 74, makes against the cord 56 to produce the bulge or rounded portion 56a that is forced into the U-shaped groove 68c. FIGS. 8 and 9 are believed sufficient to pictorially show what occurs. FIG. 8 illustrates the lateral expansion or bulging of the elastomeric sheathing 60 to form the bulge 56a in those laterally spaced portions of the groove 68c appearing in FIG. 8. FIG. 9, on the other hand, shows the pressural action of the tongue 70 which forces the elastomeric sheathing 60 forwardly into that portion of the U-shaped recess 68c appearing in FIG. 9.

Whereas the emplacement of the rear wall or panel 16 against the rear edges 44 of the casing 14 causes the rib 54 to project into the groove 46 formed in the rear edges 44 of the side walls 20, and the cord 56 sealed and held by reason of the grommet means 62, mainly the tongue 70 bearing against the segment of cord 56 passing through the U-shaped recess 68, it will be understood that the rear wall 16 must be secured in place so that it remains attached to the casing 14. This is accomplished by means of the pins 48, which have a length somewhat less than the thickness of the rear wall 16. In this way, the ends of the pins 48 do not engage the bottoms 51 of the recesses 50 formed in the rear wall 16 when the rear wall 16 has been properly placed against the rear edges 44 of the casing 14 and the pins 48 received in the recesses 50.

Because the material constituting the housing 12 is a thermoplastic material, namely, a fiberglass reinforced polycarbonate, it follows that the snuggly fitting pins 48 are press fitted in the recesses 50 and thus provide a sufficient contact area so that when sonic welding energy is applied to the entire rear wall 16, the various pins 48 are permanently welded to the sides of the recesses 50. At the same time the rib 54 is securely welded to the plastic material forming the groove 46. Still further, the tongue 70 is welded within the U-shaped recess 68.

Consequently, by reason of the interfitting parts herein described, and through the expedient of the sonic welding energy to which these parts are subjected, the housing 12 becomes a unitized structure that is for all intents and purposes completely sealed, fully resisting the entrance of any moisture in the void or cavity 22 contained therein.

Additionally, the overhanging or shielding effect provided by the portion 21a, assisted by the side portions 21c and 21d, prevent sun rays from striking directly the front wall 18 (actually the overlying thin sheet 38) in the region of the cavity 24, and hence in the area where the neon lamp 28 is located. Consequently, the lamp 28, which blinks on and off when the unit 40 is supplying high voltage pulses to an electric fence, can be easily seen by the farmer or rancher; in this way he is visually apprised of the fact that the electric fencer 10 is operating properly, for if the lamp 28 does not flash intermittently, the fencer is not energizing the fence as it is intended to do. With prior art fencers, it has been difficult in bright sunlight to see the somewhat feeble lamp light at any distance.

We claim:

1. An electric fencer comprising a housing including a casing having a front wall and integral side walls extending rearwardly from said front wall to provide rear edges on said side walls residing in a plane spaced from said front wall, a number of spaced pins extending rearwardly from the plane of said rear edges and located inwardly adjacent said rear edges, and a flat rear panel having a number of recesses registrable with said pins, said pins being anchored within said recesses to retain said rear panel in place against the rear edges of said side walls.

2. An electric fencer in accordance with claim 1 in which said pins are of a thermoplastic material and are sonically welded within said recesses to retain said rear panel in place.

3. An electric fencer in accordance with claim 2 in which said thermoplastic material is a polycarbonate.

4. An electric fencer in accordance with claim 2 in which said recesses extend partway through said rear panel and said pins are of a length less than the depth of said recesses so the end portions thereof are spaced from the bottoms of said recesses.

5. An electric fencer in accordance with claim 1 in which said pins are cylindrical and said recesses are circular, the diameter of said pins being slightly greater than the diameter of said recesses so as to provide a press fit.

6. An electric fencer in accordance with claim 1 in which said rear edges have a substantially continuous groove formed therein and said rear wall has a substantially continuous rib formed thereon received in said groove.

7. An electric fencer in accordance with claim 1 in which one of said side walls has a U-shaped recess for the accomodation of a generally cylindrical section of a power cord therein, said U-shaped recess being formed with a U-shaped groove extending forwardly from the rear edge of said one wall, and a tongue integral with said rear panel for pressing against said cylindrical power cord section to grip and hold said power cord section, said tongue being formed with a U-shaped notch, said tongue and U-shaped groove being in registry with each other and said tongue having a bight projecting from said rear panel a distance generally equal to the depth of said groove and the thickness of said bight corresponding generally to the width of said groove.

8. An electric fencer in accordance with claim 7 in which said pins are anchored within said recesses by sonic welding.

9. An electric fencer in accordance with claim 7 in which said tongue is sonically welded within said U-shaped recess.

10. An electric fencer comprising a housing including a casing having a front wall and integral side walls extending rearwardly from said front wall to provide rear edges on said side walls residing in a plane spaced from said front wall, one of said side walls constituting a top wall having a portion thereof projecting forwardly from said front wall, a number of spaced pins extending rearwardly from the plane of said rear edges, and a rear wall having a number of recesses registrable with said pins, said pins being anchored within said recesses to retain said rear wall in place against the rear edges of said side walls.

11. An electric fencer in accordance with claim 10 including a lamp, said lamp being mounted near said forwardly projecting portion.

12. An electric fencer in accordance with claim 11 in which two of the remaining side walls incline upwardly and forwardly to the forward edge of said projecting portion.

* * * * *